United States Patent
Kamiyama et al.

(10) Patent No.: US 7,838,387 B2
(45) Date of Patent: Nov. 23, 2010

(54) METHOD FOR MANUFACTURING SOI WAFER

(75) Inventors: Eiji Kamiyama, Chiba-ken (JP); Seiichi Nakamura, Chiba (JP); Tetsuya Nakai, Chiba (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/118,928

(22) Filed: May 12, 2008

(65) Prior Publication Data

US 2008/0213989 A1    Sep. 4, 2008

Related U.S. Application Data

(62) Division of application No. 11/331,216, filed on Jan. 13, 2006, now Pat. No. 7,655,315.

(51) Int. Cl.
*H01L 21/762* (2006.01)

(52) U.S. Cl. .................. 438/407; 438/978; 257/347; 257/623; 257/E27.112; 257/E27.563

(58) Field of Classification Search .............. 438/149, 438/407
See application file for complete search history.

(56) References Cited

U.S. PATENT DOCUMENTS

| | | | |
|---|---|---|---|
| 5,110,764 A | 5/1992 | Ogino | |
| 5,152,857 A | 10/1992 | Ito | |
| 5,751,055 A | 5/1998 | Maruyama et al. | |
| 6,150,696 A * | 11/2000 | Iwamatsu et al. | 257/347 |
| 6,583,029 B2 | 6/2003 | Abe et al. | |
| 7,023,051 B2 * | 4/2006 | Forbes | 257/347 |
| 2004/0041143 A1 | 3/2004 | Kim et al. | |
| 2004/0072437 A1 | 4/2004 | Iizuka et al. | |

FOREIGN PATENT DOCUMENTS

| | | |
|---|---|---|
| JP | 06-061201 | 3/1994 |
| JP | 11-204452 | 7/1999 |
| JP | 2003-229340 | 1/2002 |
| JP | 2005-129676 | 5/2005 |

* cited by examiner

*Primary Examiner*—Mary Wilczewski
*Assistant Examiner*—Toniae M Thomas
(74) *Attorney, Agent, or Firm*—Antonelli, Terry, Stout & Kraus, LLP.

(57) ABSTRACT

A silicon wafer includes a principal face for forming electronic devices; an end region; and a tapered region which is located between the principal face and the end region, in which the thickness of the silicon wafer is gradually reduced, and which has a slope that makes an angle of greater than zero degree and less than 9.5 degrees or an angle of greater than 19 degrees with the principal face. An SOI wafer prepared by forming a buried oxide layer in a silicon wafer includes a principal face, end region, and tapered region that are substantially the same as those described above. A method for manufacturing an SOI wafer includes the steps of implanting oxygen ions into a silicon wafer; and heat-treating the resulting silicon wafer such that a buried oxide layer is formed in the silicon wafer.

4 Claims, 5 Drawing Sheets

METHOD FOR MANUFACTURING SOI WAFER

CROSS-REFERENCE TO RELATED APPLICATION

This application is a divisional application of U.S. application Ser. No. 11/331,216, filed Jan. 13, 2006, now U.S. Pat. No. 7,655,315 the contents of which are incorporated herein by reference.

BACKGROUND OF THE INVENTION

1. Field of the Invention

The present invention relates to SOI wafer techniques, and particularly relates to SOI wafer techniques which be made by SIMOX process in which oxygen ions are implanted into a silicon wafer and the resulting a buried oxide layer is formed in the silicon wafer, that is an SIMOX wafer techniques.

2. Description of the Related Art

There are some known methods for manufacturing SOI (Silicon on Insulator) wafers each including two silicon layers and an oxide layer, serving as an insulating layer, sandwiched therebetween. For example, U.S. Pat. No. 3,036,619 and U.S. Pat. Nos. 5,930,643, 6,043,166, and 6090689 each disclose a SIMOX (Separation-by-Implanted-Oxygen) process in which oxygen ions are implanted into a silicon wafer and the resulting silicon wafer is annealed at a predetermined temperature such that a layer referred to as a BOX (Buried Oxide) layer or an insulating layer is formed in the silicon wafer. Also, for example, Japanese Patent No. 3031904 and U.S. Pat. No. 5,374,564 each disclose a bonding process in which an oxide layer is formed on a first silicon wafer and then bonded to a second silicon wafer and the thickness of the first silicon wafer is reduced to a predetermined value.

An oxide layer is partly exposed from an end region of an SOI wafer manufactured by the known SIMOX process or the bonding process. Therefore, if the SOI wafer is cleaned with a hydrofluoric acid solution during the manufacture of electronic devices and the like, an exposed portion of the oxide layer is dissolved in the solution, whereby silicon layers separated by the oxide layer are peeled off from the oxide layer. This causes a reduction in the yield of the electronic devices. Hence, the oxide layer must be prevented from being exposed from the SOI wafer.

However, a side face of an oxide layer is usually exposed from an SOI wafer manufactured by the bonding process as disclosed in Japanese Patent No. 3031904 and U.S. Pat. No. 5,374,564. Therefore, it is difficult to prevent the exposure of the oxide layer.

On the other hand, for the SIMOX process, Japanese Unexamined Patent Application Publication No. 2001-308025 discloses a technique for preventing the exposure of a buried oxide layer from a SOI wafer. In the technique, oxygen ions are implanted into the SOI wafer in such a manner that end regions of the SOI wafer is covered with a mask such that the oxygen ions are not implanted into the covered end regions, whereby the buried oxide layer is prevented from extending to end regions of the SOI wafer.

SUMMARY OF THE INVENTION

The technique disclosed in Japanese Unexamined Patent Application Publication No. 2001-308025 requires a step of forming the mask on a principal face of the SOI wafer and a step of removing the mask. Therefore, a method for manufacturing an SOI wafer using the technique is complicated. This leads to an increase in manufacturing cost. Steps are present between the covered end regions and uncovered regions. This leads to a reduction in the quality of the SOI wafer. In order to eliminate these problems, the following technique has been being demanded: a technique for preventing the exposure of the buried oxide layer from the SOI wafer without using any mask.

It is an object of the present invention to provide a technique for preventing the exposure of an oxide layer from an SOI wafer without using any mask.

The inventors have investigated the shapes of silicon wafers into which oxygen ions are implanted by a SIMOX process. In particular, the inventors have investigated the shape of a tapered region located between an end region and principal face of a silicon wafer for forming electronic devices. The investigation has shown that the shape of the tapered region correlates to the exposure of an oxide layer formed by the SIMOX process.

A silicon wafer, according to the present invention, for manufacturing an SOI wafer by the implantation of oxygen ions has a principal face for forming electronic devices; an end region; and a tapered region which is located between the principal face and the end region, in which the thickness of the silicon wafer is gradually reduced, and which has a slope that makes an angle of greater than zero degree and less than 9.5 degrees or an angle of greater than 19 degrees with the principal face.

An SOI wafer, according to the present invention, prepared by forming a buried oxide layer in a silicon wafer has a principal face for forming electronic devices; an end region; and a tapered region which is located between the principal face and the end region, in which the thickness of the SOI wafer is gradually reduced, and which has a slope that makes an angle of greater than zero degree and less than 9.5 degrees or an angle of greater than 19 degrees with the principal face.

In this SOI wafer, this tapered region may have a plurality of slopes that make different angles with this principal face. These angles are preferably greater than zero degree and less than 9.5 degrees or greater than 19 degrees.

A method for manufacturing an SOI wafer according to the present invention includes the steps of implanting oxygen ions into a silicon wafer and heat-treating the resulting silicon wafer such that a buried oxide layer is formed in the silicon wafer. The silicon wafer has a principal face for forming electronic devices; an end region; and a tapered region which is located between the principal face and the end region, in which the thickness of the SOI wafer is gradually reduced, and which has a slope that makes an angle of greater than zero degree and less than 9.5 degrees or an angle of greater than 19 degrees with the principal face.

In the SOI wafer manufactured by the method, the dose of the oxygen ions in the tapered region is less than that in the principal face; hence, the oxide layer and/or oxides can be prevented from being exposed from the SOI wafer without using any mask.

If an SOI wafer is manufactured by the method using a silicon wafer in which the angle made by a slope and a principal face is 20 degrees or more, an oxide layer and/or oxides can be more securely prevented from being exposed from this SOI wafer without using any mask.

BRIEF DESCRIPTION OF THE DRAWINGS

An SOI wafer according to an embodiment of the present invention, a silicon wafer for manufacturing the SOI wafer, and a method for manufacturing the SOI wafer according to an embodiment of the present invention will now be described with reference to FIGS. 1 to 10.

DESCRIPTION OF THE PREFERRED EMBODIMENTS

FIGS. 1 and 3 to 7 are schematic illustrations of the SOI wafers observed with a scanning electron microscope or a scanning ion beam microscope. The SOI wafers have been manufactured by a SIMOX process and then annealed and from which thermal oxides have been removed. FIGS. 1 and 3 to 7 are used to show the arrangements of layers but do not show the actual thicknesses of the layers.

Figure 1:
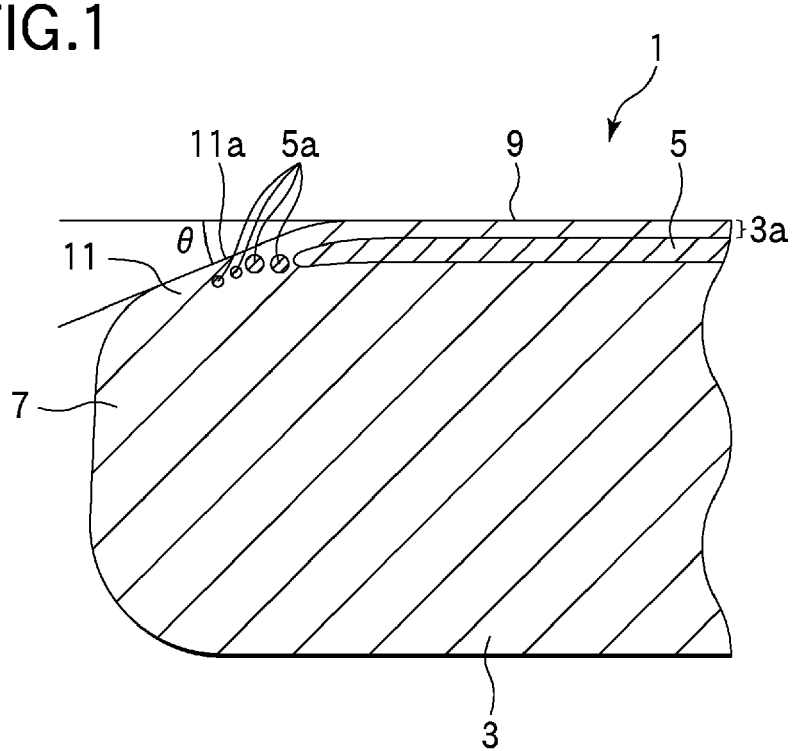
FIG. 1 is a schematic sectional view of an SOI wafer according to an embodiment of the present invention.
Figure 2:
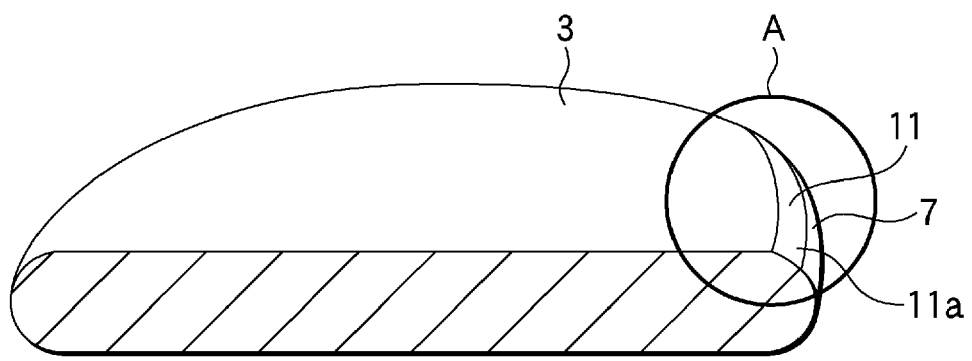
FIG. 2 is a perspective sectional view of a silicon wafer for manufacturing the SOI wafer.

The SOI (Silicon on Insulator) wafer 1 in this embodiment prepared by a SIMOX (Separation-by-Implanted-Oxygen) process includes an oxide layer 5 formed by implanting oxygen ions into a single-crystalline silicon wafer 3 as shown in FIG. 1. The oxide layer 5 is a BOX (Buried Oxide) layer serving as an insulating layer. The SOI wafer 1 is disk-shaped as shown in FIG. 2. The SOI wafer 1, as shown in FIG. 1, has an end region 7, a flat principal face 9 for forming electronic devices, and a tapered region 11 which is located between the end region 7 and the principal face 9 and in which the thickness of the SOI wafer 1 is gradually reduced. The tapered region 11 has a slope 11a that makes an angle θ of greater than zero degree and less than 9.5 degrees or an angle of greater than 19 degrees with the principal face 9.

Since the angle θ made by the slope 11a and the principal face 9 is greater than zero degree and less than 9.5 degrees or greater than 19 degrees, the oxide layer 5 is terminated at a position before the end region 7. The tapered region 11 includes islanded and/or dotted oxides 5a spaced from the oxide layer 5. The end region 7 includes no dotted oxides 5a.

Figure 3:
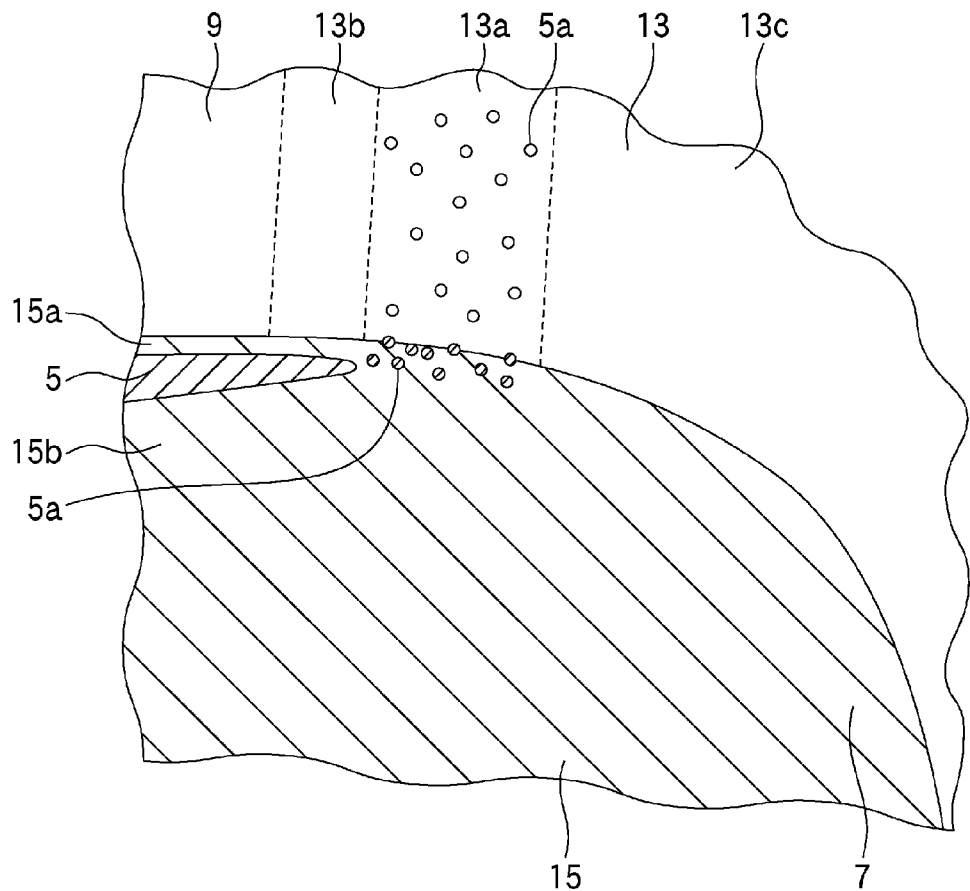
FIG. 3 is an enlarged sectional view of a section of an SOI wafer which has an end region and a curved shoulder region adjacent thereto and from which oxides are exposed, the section corresponding to section A of FIG. 2.

The relationship, discovered by the inventors, between the shape of a tapered region located between an end region and a principal face of a silicon wafer for forming electronic devices and the exposure of an oxide layer formed by a SIMOX process will be described. In order to investigate the relationship among the condition of the exposure of an oxide layer formed by the SIMOX process implanting oxygen ions, the inventors have prepared an SOI wafer in such a manner that oxygen ions are implanted into a single-crystalline silicon wafer 15 having an end region 7, a principal face 9, and a shoulder region 13 which is located therebetween and which is curved in cross section according to the SIMOX process as shown in FIG. 3. The inventors have then measured the angle made by the principal face 9 and a line tangent to the shoulder region 13 and checked the surface of the shoulder region 13. The SOI wafer includes two single-crystalline silicon layers 15a and 15b and an oxide layer 5, sandwiched therebetween, serving as an insulating layer. The single-crystalline silicon layer 15a is located close to the principal face 9, serves as an SOI layer, and has a thickness of about 560 Å, and a portion located under the principal face 9 of the oxide layer 5 which is the insulating layer has a thickness of about 1,360 Å.

Figure 4:
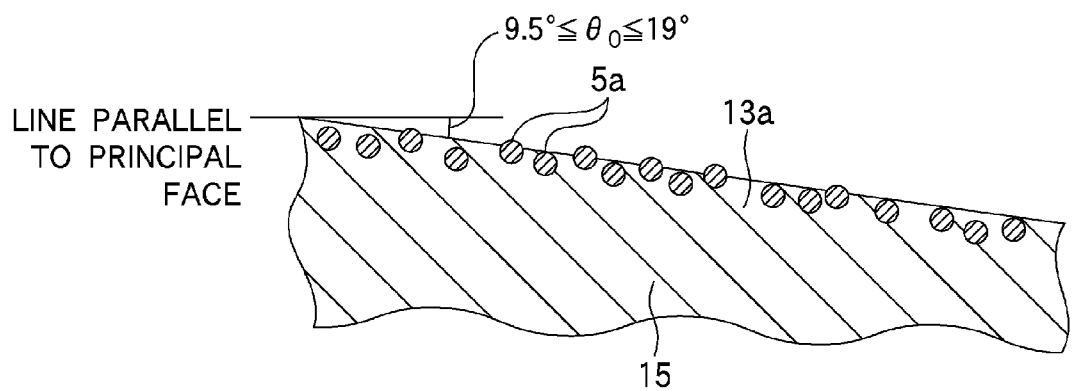
FIG. 4 is an enlarged sectional view of a region of the SOI wafer shown in FIG. 3, the region having the oxides exposed therefrom.

As shown in FIG. 4, the islanded and/or dotted oxides 5a are exposed from a domain 13a of the shoulder region 13 in which the angle $\theta_0$ made by the principal face 9 and a line tangent to the domain 13a is 9.5 to 19 degrees. A portion of the domain 13a in which the angle $\theta_0$ is 9.5 to ten degrees has an irregular surface and includes the islanded and/or dotted oxides 5a exposed therefrom. Another portion of the domain 13a in which the angle $\theta_0$ is about ten to 19 degrees includes no islanded and/or dotted oxides 5a or no portions of the oxide layer 5. If this SOI wafer is cleaned with a hydrofluoric acid solution during the manufacture of the electronic devices, the islanded and/or dotted oxides 5a exposed from the domain 13a will be dissolved in the hydrofluoric acid solution and both of the single-crystalline silicon layers 15 separated with the oxide layer 5 will be therefore peeled off from the oxide layer 5.

Figure 5:
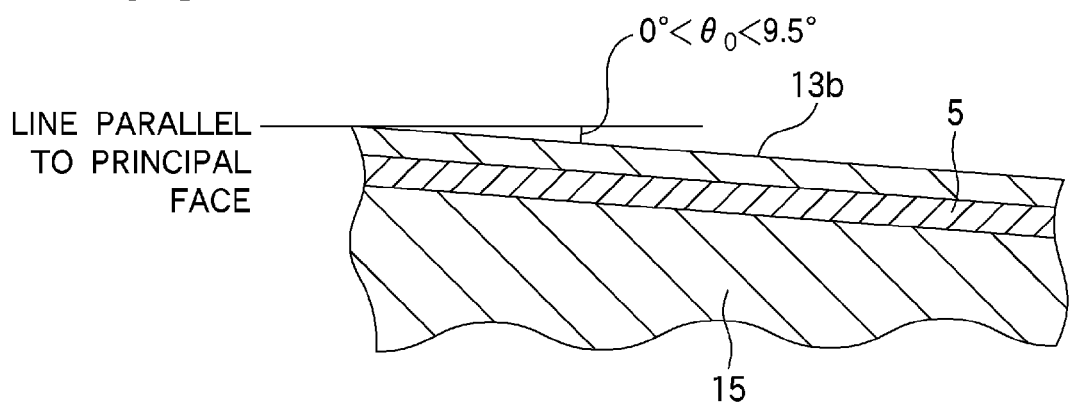
FIG. 5 is an enlarged sectional view of a region of the SOI wafer shown in FIG. 3, the region having a portion of an oxide layer extending therein but no oxides.
Figure 6:
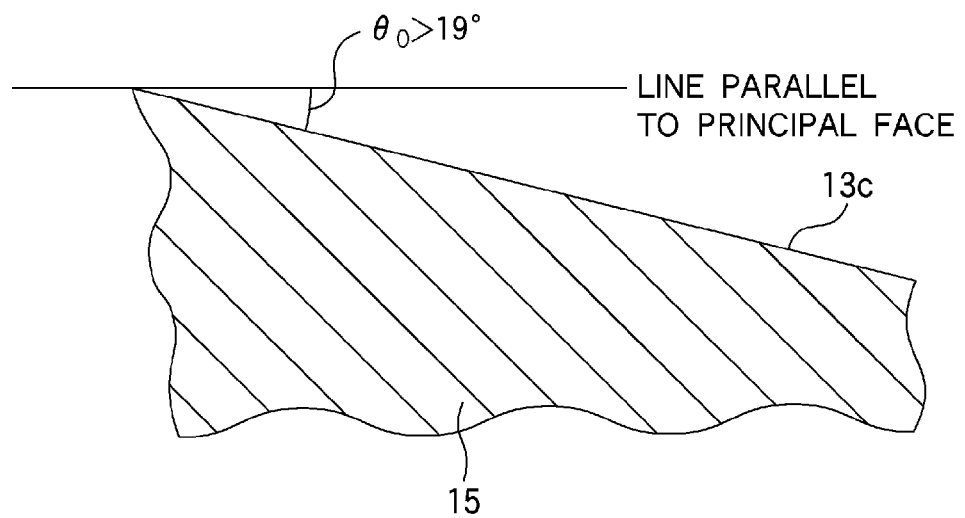
FIG. 6 is an enlarged sectional view of a region of the SOI wafer shown in FIG. 3, the region having no oxides.

In contrast, as shown in FIG. 5, no islanded and/or dotted oxides 5a are exposed from a domain 13b of the shoulder region 13 in which the angle $\theta_0$ made by the principal face 9 and a line tangent to the domain 13b is greater than zero degree and less than 9.5 degrees. Furthermore, as shown in FIG. 6, no islanded and/or dotted oxides 5a are exposed from a domain 13c of the shoulder region 13 in which the angle $\theta_0$ made by the principal face 9 and a line tangent to the domain 13c is greater than 19 degrees. No islanded and/or dotted oxides 5a are exposed from another domain of the shoulder region 13 in which the angle $\theta_0$ made by the principal face 9 and a line tangent to this domain is 23 degrees or more and this domain has a surface with no irregularities. The reason why the state of the islanded and/or dotted oxides 5a is varied depending on the domains of the shoulder region 13 is probably that the dose of the implanted oxygen ions per unit area decreases with an increase in the tilt angle of each domain into which the oxygen ions are implanted.

From these results, the inventors have discovered that the oxide layer can be prevented from being exposed from the SOI wafer and/or the number of the portion of the oxide layer exposed the SOI wafer can be reduced in such a manner that the SOI wafer 1 is prepared by the SIMOX process using the single-crystalline silicon wafer 3, shown in FIG. 1, having the tapered region 11 which is located between the principal face 9 and the end region 7 and which has the slope 11a that makes an angle θ of greater than zero degree and less than 9.5 degrees or an angle of greater than 19 degrees with the principal face 9 instead of the single-crystalline silicon wafer 15 having the shoulder region 13 which is located between the principal face 9 and the end region 7 and which is curved in cross section.

The inventors have actually confirmed that the oxide layer can be prevented from being exposed from the SOI wafer 5 and/or the number of the portion of the oxide layer exposed the SOI wafer can be reduced as described above.

The angle θ made by the slope 11a and the principal face 9 is preferably greater than 19 degrees and more preferably 20 degrees or more. This is effective in securely preventing the exposure of the oxide layer from the SOI wafer and/or effective in reducing the number of the portion of the oxide layer exposed the SOI wafer.

A method for manufacturing the SOI wafer 1 is similar to a known SIMOX process except the use of the single-crystalline silicon wafer 3 having the tapered region 11 which is located between the principal face 9 and the end region 7 and which has the slope 11a that makes an angle θ of greater than zero degree and less than 9.5 degrees or an angle of greater than 19 degrees with the principal face 9. In particular, the oxygen ions are implanted into the SOI wafer 1 and the resulting SOI wafer 1 is annealed at a high temperature, for example, 1,300° C., in an oxidizing atmosphere such as an atmosphere containing Ar and $O_2$. The resulting SOI wafer 1 includes an SOI layer 3a located more close to the principal face 9 than the oxide layer 5. The SOI layer 3a preferably has a thickness greater than that of the oxide layer 5. This is effective in securely preventing the exposure of the islanded and/or dotted oxide layer 5 from the SOI wafer 1 and/or effective in reducing the number of the oxide layer exposed from the SOI wafer 1.

Since the SOI wafer 1 is manufactured as described above, the oxide layer 5 can be prevented from being exposed from the SOI wafer 1 and the number of the oxides 5a exposed from the SOI wafer 1 can be reduced without using any mask.

Figure 7:
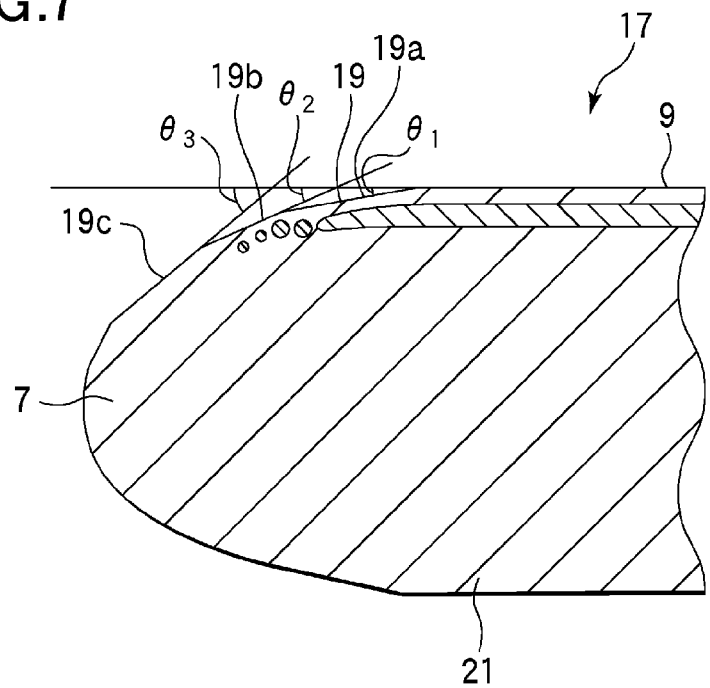
FIG. 7 is a schematic sectional view of a modification of the SOI wafer of the embodiment.

In this embodiment, the tapered region 11 has the single slope 11a. However, the tapered region 11 may has a plurality of slopes with different tilt angles. For example, an SOI wafer 17, as shown in FIG. 7, has a principal face 9, an end region 7, and a tapered region 19 which is located between the principal face 9 and the end region 7 and which has three slopes 19a, 19b, and 19c arranged from the principal face 9 in that order. The slopes 19a, 19b, and 19c make angles $\theta_1$, $\theta_2$, and $\theta_3$, respectively, with the principal face 9 and are arranged in increasing order of angle. The angles $\theta_1$, $\theta_2$, and $\theta_3$ are greater than zero degree and less than 9.5 degrees or greater than 19 degrees. A silicon wafer 21 having the tapered region 19 with the slopes 19a, 19b, and 19c may be used to manufacture the SOI wafer 17.

EXAMPLES

Examples of the present invention and a comparative example will now be described. In the examples, SOI wafers were prepared using silicon wafers similar to the single-crystalline silicon wafer 3 described in the above embodiment. In the comparative example, an SOI wafer was prepared using a silicon wafer which had a tapered region, adjacent to an end region, having a slope and in which the angle made by the slope and a principal face was outside the scope of the present invention.

Figure 8:
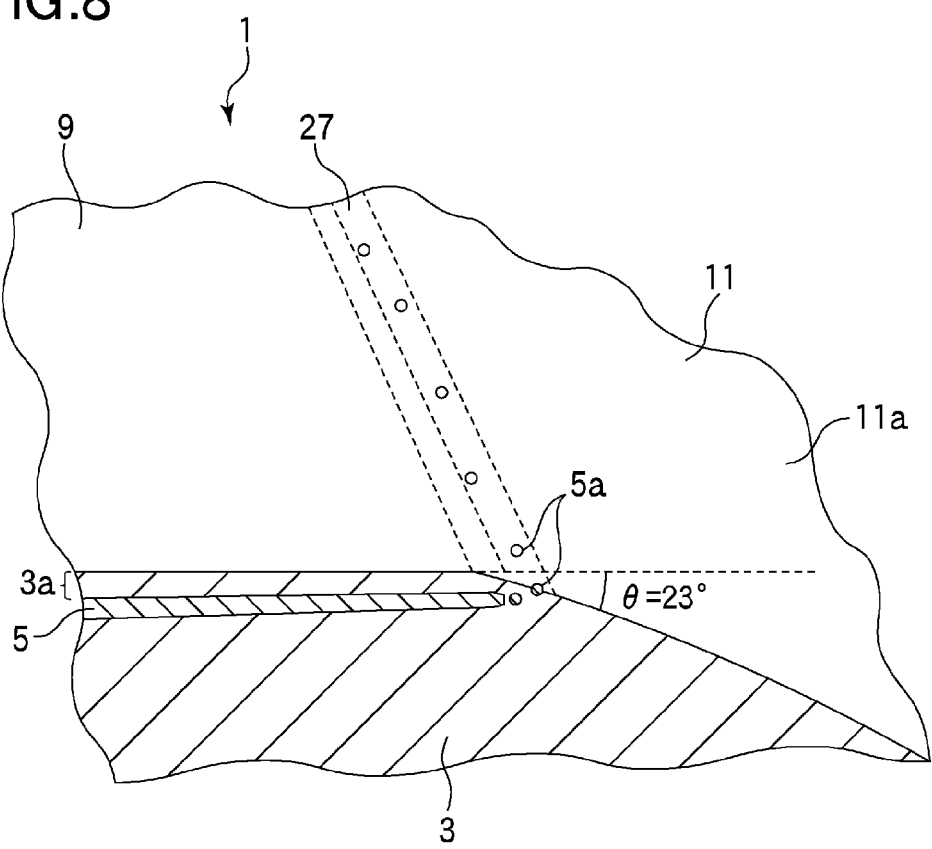
FIG. 8 is an enlarged sectional view of a section of an SOI wafer of Example 1, in which this SOI wafer includes an oxide layer and has a slope with an angle of 23 degrees and this section corresponds to section A of FIG. 2.
Figure 9:
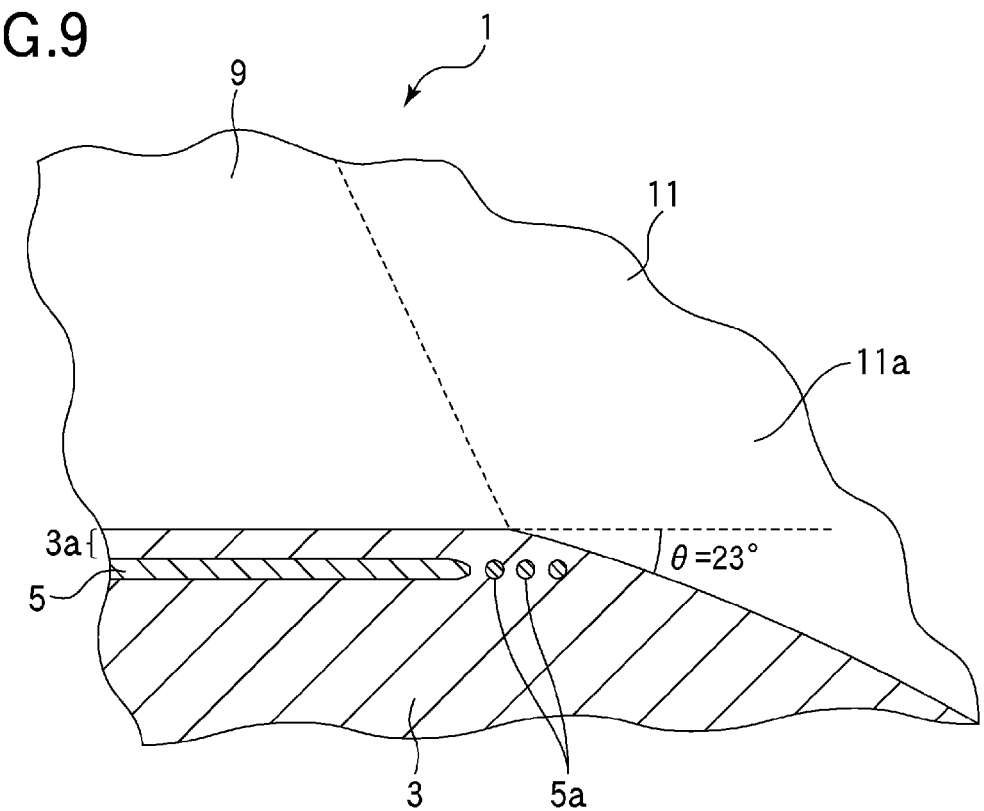
FIG. 9 is an enlarged sectional view of a section of an SOI wafer of Example 2, in which this SOI wafer includes an oxide layer and other layers and has a slope with an angle of 23 degrees, these layers have thicknesses different from those of layers included in the SOI wafer of Example 1, and this section corresponds to section A of FIG. 2.
Figure 10:
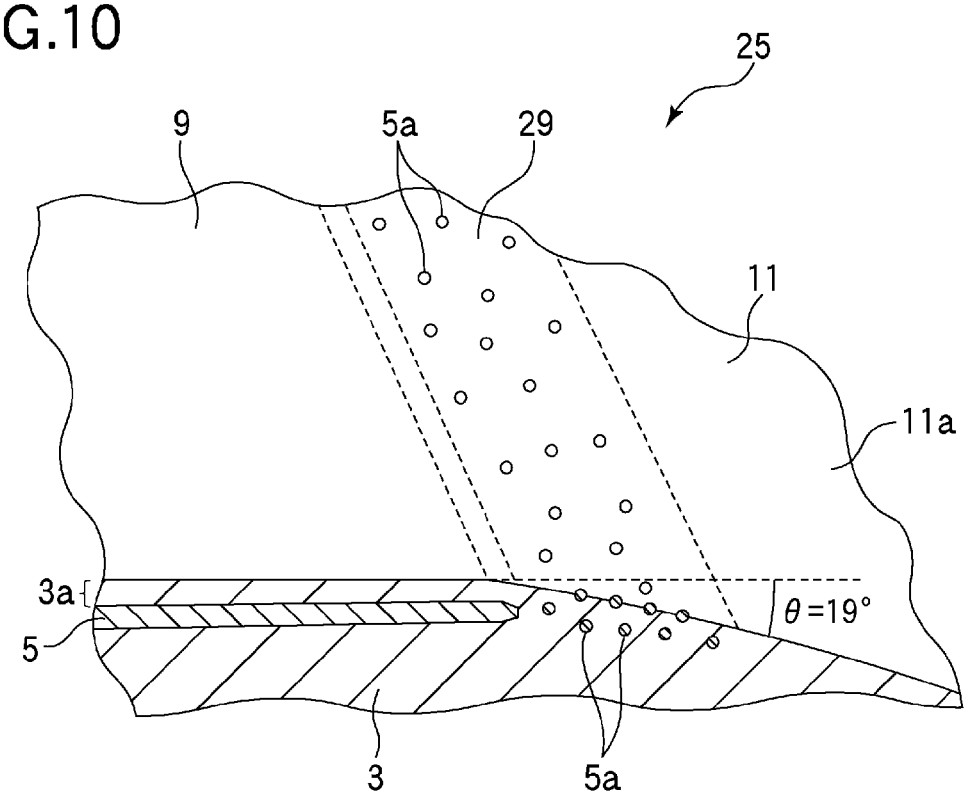
FIG. 10 is an enlarged sectional view of a section of an SOI wafer of Comparative Example 1, in which this SOI wafer includes an oxide layer and has a slope with an angle of 19 degrees and this section corresponds to section A of FIG. 2.

These SOI wafers have been manufactured by a SIMOX process and then annealed and thermal oxides have been removed from the surfaces of these SOI wafers. FIGS. 8 to 10 are schematic illustrations of these SOI wafers observed by scanning ion beam microscopy. Therefore, FIGS. 8 to 10 are used to show the arrangements of layers but do not show the actual thicknesses of the layers.

Example 1

The SOI wafer 1 of this example was prepared by the SIMOX process using a single-crystalline silicon wafer 3 similar to that, shown in FIGS. 1 and 2, described in the above embodiment in such a manner that oxygen ions were implanted into the single-crystalline silicon wafer 3 and the resulting single-crystalline silicon wafer 3 was annealed at 1,300° C. for ten hours in an atmosphere containing Ar and $O_2$. The single-crystalline silicon wafer 3 had a principal face 9 and a tapered region 11 with a slope that made an angle θ of 23 degrees with the principal face 9. In the ion implantation, the dose of the oxygen ions, the acceleration voltage, the projected range, and other conditions were adjusted such that the SOI wafer 1 included an SOI layer 3a with a thickness of 700 Å and an oxide layer 5, located below the principal face 9, having a thickness of 1,400 Å. After thermal oxides were removed from the surface of the SOI wafer 1, a cross section of the resulting SOI wafer 1 was observed with a scanning ion beam microscope.

Example 2

The SOI wafer 1 of this example was prepared using a single-crystalline silicon wafer 3 having substantially the same configuration as that of the single-crystalline silicon wafer 3 described in Example 1 in substantially the same manner as that described in Example 1 except that this SOI wafer 1 included an SOI layer 3a with a thickness of 2,500 Å and an oxide layer 5, located below a principal face 9, having a thickness of 700 Å. After thermal oxides were removed from the surface of this SOI wafer 1 as well as that SOI wafer 1 of Example 1, a cross section of this resulting SOI wafer 1 was observed with a scanning ion beam microscope.

Comparative Example 1

The SOI wafer 1 of the comparative example was prepared in substantially the same manner as that described in Example 1 or 2 except that a single-crystalline silicon wafer 3 used had a principal face 9 and tapered region 11 with a slope 11a that made an angle θ of 19 degrees. This SOI wafer 1 included an SOI layer 3a with a thickness of 700 Å and an oxide layer 5, located below a principal face 9, having a thickness of 1,400 Å. After thermal oxides were removed from the surface of this SOI wafer 1 as well as those SOI wafers 1 of Examples 1 and 2, a cross section of this resulting SOI wafer 1 was observed with a scanning ion beam microscope.

In the SOI wafer 1 of Example 1, as shown in FIG. 8, a small number of dotted oxides 5a are exposed from a domain 27 of the slope 11a and the domain 27 has a width of about 20 μm. In the SOI wafer 1 of Example 2, as shown in FIG. 9, no islanded and/or dotted oxides 5a are exposed from the slope 11a. In contrast, in the SOI wafer 1 of Comparative Example 1, as shown in FIG. 10, a large number of dotted oxides 5a are exposed from a domain 29 of the slope 11a and the domain 29 has a width of about 125 μm.

In the SOI wafer 1 of Example 1, although the oxides 5a are exposed from the domain 27, the width of the domain 27 is less than the domain 29 of the SOI wafer 1 of Comparative Example 1 and the number of the oxides 5a exposed from the domain 27 is therefore less than that of the oxides 5a exposed from the domain 29. Hence, when the SOI wafer 1 of Example 1 was cleaned with a hydrofluoric acid solution, the oxide layer 5 of this SOI wafer 1 was prevented from being dissolved in the solution although the oxides 5a exposed from this SOI wafer 1 were dissolved in the solution; therefore, the silicon layer of this SOI wafer 1 was prevented from being peeled off from this oxide layer 5. In contrast, when the SOI wafer 1 of Comparative Example 1 was cleaned with a hydrofluoric acid solution, the oxide layer 5 of this SOI wafer 1 was dissolved in this solution; therefore, the silicon layer of this SOI wafer 1 was peeled off from this oxide layer 5.

What is claimed is:

1. A method of manufacturing an SOI wafer, comprising the steps of:
   implanting oxygen ions into a silicon wafer; and
   heat-treating the resulting silicon wafer such that a buried oxide layer is formed in the silicon wafer,
   wherein the silicon wafer has a principal face for forming electronic devices;
   an end region and a tapered region which is located between the principal face and the end region, in which the thickness of the silicon wafer is gradually reduced, and which has at least three portions each having a finite width and having three slopes each having a different angle $\theta 1$, $\theta 2$, and $\theta 3$, respectively, with the principal face and arranged with increasing order of angle from the principal face in series, wherein the angle $\theta 1$ is greater than 0 degrees and less than 9.5 degrees, or greater than 19 degrees, the angle $\theta 2$ is greater than 0 degrees and less than 9.5 degrees, or greater than 19 degrees and the angle $\theta 3$ are is greater than 0 degrees and less than 9.5 degrees, or greater than 19 degrees.

2. The method according to claim 1, wherein the angles $\theta 1$, $\theta 2$ and $\theta 3$ are greater than 20 degrees with the principal face.

3. The method according to claim 1, wherein the at least three portions are not curved in cross-section and the angles $\theta 1$, $\theta 2$ and $\theta 3$ are greater than 0 degrees and less than 9.5 degrees.

4. The method according to claim 1, wherein the at least three portions are not curved in cross-section and the angles $\theta 1$, $\theta 2$ and $\theta 3$ are greater than 19 degrees.

* * * * *